June 26, 1951 O. L. MacSORLEY 2,558,448
FREQUENCY CONTROL SYSTEM
Filed Nov. 25, 1949
Fig. 1.
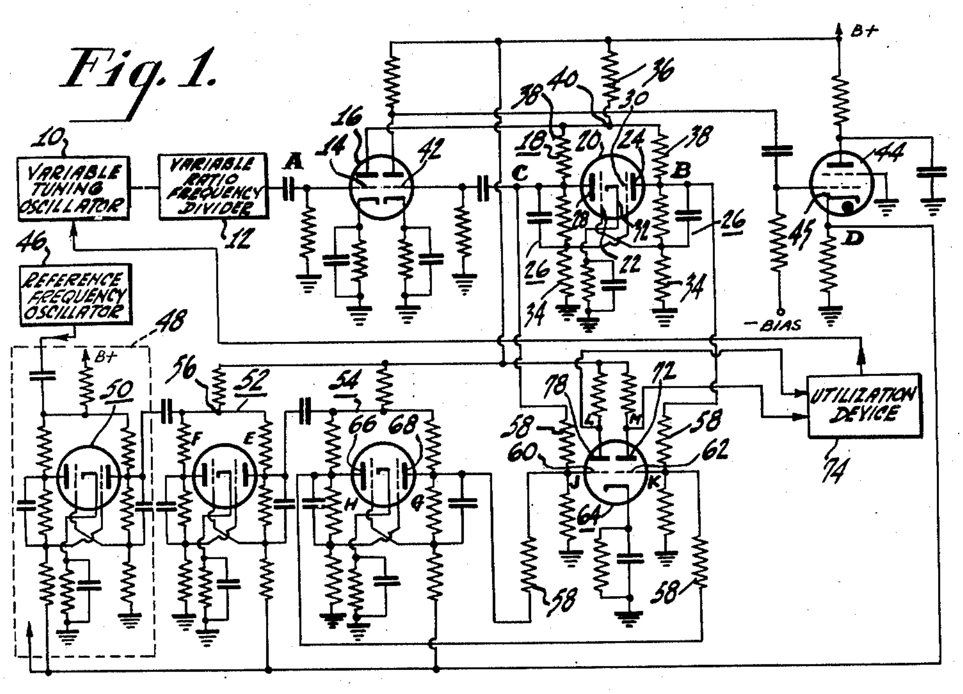
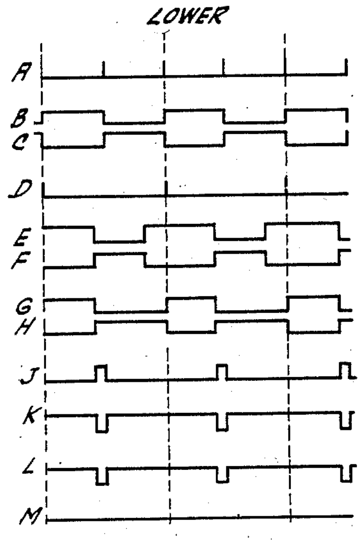
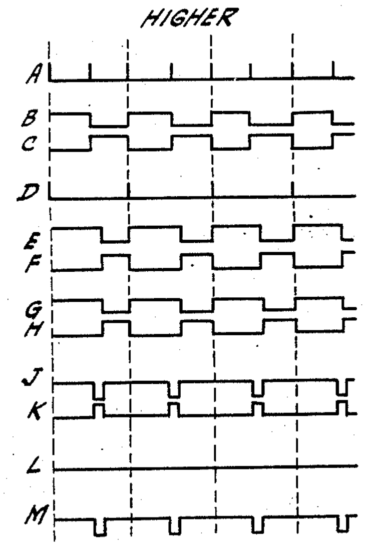
Fig. 2. Fig. 3.
Inventor
Olin L. MacSorley
By Morris A. Rabkin
Attorney Patented June 26, 1951

2,558,448

UNITED STATES PATENT OFFICE 2,558,448

FREQUENCY CONTROL SYSTEM

Olin L. MacSorley, Collingswood, N. J., assignor to Radio Corporation of America, a corporation of Delaware Application November 25, 1949, Serial No. 129,243

6 Claims. (Cl. 250—27)

This invention relates to frequency control apparatus and more particularly is an improvement in apparatus for controlling the frequency of a variable oscillator by means of a reference oscillator.

Oscillation generating systems have been developed for transmitters, receivers and the like wherein a variably tuned oscillator has its frequency accurately controlled by means of a crystal controlled reference frequency oscillator. This control is achieved by coupling the output of the variably tuned oscillator to a counter or frequency divider which is so controlled in conjunction with the tuning arrangements of the oscillator as to produce a substantially constant low frequency output for all variations in tuning of the oscillator. The crystal controlled reference frequency oscillator has its output coupled to a counter or frequency divider which has a fixed division ratio. The outputs from the variable and fixed counters then have their phases compared in some type of comparing system which generates an error voltage dependent upon the difference in phase. This error voltage is used to control apparatus which corrects the frequency of the variably tuned oscillator to the exact value desired.

One such system is described and claimed in the commonly owned, copending application of John D. Woodward, Serial No. 743,234, filed April 24, 1947, for "Automatic Frequency Control," now Patent No. 2,490,499. The comparing system for obtaining a corrective error signal described in this application is a phase detector to which is applied the reference frequency derived from a crystal controlled generator and the output derived from a variable frequency oscillator feeding a variable ratio frequency divider chain. The phase detector output is used to control a reactance tube which, in turn, is used to control the frequency of the variably tuned oscillator.

Prior art systems, such as the one herein described, provide accurate frequency control for frequency deviations within their control range. However, the range of frequency control is limited due to the inherent structural limitations of a phase detector and reactance tube. Should a variably tuned oscillator deviate in frequency outside of the limited control range of its frequency control system, no control of its frequency can be maintained. In order to maintain control of this frequency a system is required which can provide frequency control voltages over a wider frequency deviation range than the presently known systems.

It is therefore an object of my present invention to provide an improved frequency control system which provides proper frequency control voltages over a wider frequency deviation range than heretofore.

Prior art frequency control systems generally use tuned resonant circuits. These are expensive and usually require an expenditure of time in both the initial tuning and in the subsequent maintenance of the tuned circuits.

It is a further object of my present invention to provide an improved frequency control system which does not require resonant circuits.

It is still a further object of my present invention to provide an improved frequency control system which is inexpensive.

These and further objects are achieved in my present invention by providing apparatus consisting essentially of three identical binary dividers, a first of which is coupled to a thyratron tube to cause it to fire and generate a reset pulse for every second pulse impressed on the first binary divider. The second and third binary dividers are connected in tandem, the third being driven by the output from the second. The reset pulse output from the thyratron is applied to similar portions of the second and third binary divider circuits in such fashion that the second binary divider requires the application of an additional input pulse after a reset pulse before it can apply an operating pulse to the input of the third binary divider. Reference frequency pulses are applied to the input of the second binary divider. Pulses from a frequency source to be stabilized are applied to the input of the first binary divider. The outputs from the first binary divider and the third binary divider are combined in phase opposition. This is done by respectively coupling the two anodes of the first binary divider so that the voltages generated at the respective coupled anodes are in opposition.

Each of the two resultant outputs is respectively coupled to each of the grids of a dual triode tube. The tube is so biased that either triode will conduct only if both of the anodes connected to the grid being considered are at the higher of the two possible binary divider anode voltages. The source of the reference frequency and the frequency to be stabilized may be the output from an apparatus such as is described and claimed in the above mentioned application of John D. Woodward. In that case the reference frequency is the output of a fixed ratio frequency dividing chain which is coupled to a reference oscillator and the variable frequency is the output from a variable ratio frequency dividing chain coupled to the variably tuned oscillator. The reset pulse output from the thyratron tube is applied to at least one of the preceding binary divider stages of the fixed ratio reference frequency dividing chain. However, the more stages to which the reset pulses are applied the more accurate is the operation. Care must be taken, however, that these connections are made so that following the application of a reset pulse each binary divider of the fixed frequency divider requires two input pulses before it will apply an operating pulse to the following binary divider.

If the frequencies of the first and third binary dividers are equal, since the reset pulses from the thyratron tube serve to align the phase relationships, the two binary divider outputs cancel each other and there is no output from the dual triode. If the variable frequency source pulses are higher or lower in frequency than the reference frequency pulses, the binary divider outputs do not cancel each other but resultant positive pulses are applied to either of the grids of the dual triode which have pulse widths dependent upon the amount of the difference in frequency. The one of the two grids upon which these pulses appear is determined by whether the variable frequency source pulses are lower or higher in frequency than the reference frequency pulses. The output appearing in either of the plate circuits of the dual triode tube may be applied to a utilization circuit which is responsive to these pulses and serves to correct the frequency of the variable oscillator accordingly.

The novel features of the invention, as well as the invention itself, both as to its organization and method of operation, will best be understood from the following description, when read in connection with the accompanying drawing, in which Figure 1 is a partially schematic circuit diagram of frequency control apparatus embodying my invention, and Figures 2 and 3 are a series of graphical representations of wave forms of the voltages appearing in various circuit portions of the apparatus, these being of assistance in explaining the operation of my invention.

Referring, now, to Figure 1, a variable tuning oscillator 10, such as is used to provide a desired frequency for a transmitter, has a portion of its output coupled to a variable ratio frequency divider 12. The oscillator 10 may be of any type familiar to the art. Tuning may be either by means of a variable inductance or a variable capacitor. The oscillator 10 should preferably be automatically tunable to any one of a number of equally spaced frequencies. Though not required, these frequency increments are usually multiples or submultiples of one kilocycle per second. The frequency change for any particular range of tuning must be less than two to one. Additional coverage may be obtained by the use of additional bands, or other means limiting the required control range to this value. The frequency of the oscillator 10 is controlled by the setting of the division ratio of the divider 12. The division ratio is always set so that the frequency desired divided by the division ratio is a constant. This constant output may then be compared with a constant reference frequency to determine the correctness of the oscillator setting.

The divider 12 may be any one of the well known multivibrator counting chains which has a sufficient number of counting stages to reduce the frequency of the variable ratio frequency divider to a desired low value for comparison. The output pulses of the variable ratio frequency divider 12 are usually also used as reset pulses and are fed back into the various stages of the divider for the purpose of synchronization and resetting of the divider stages to a condition such that they can start counting down again to provide another pulse. This reset pulse has a positive polarity. It is therefore impressed upon one of the grids 14 of a dual triode vacuum tube 16 which serves to amplify the pulse and invert it so that it has the proper polarity to operate a first binary divider.

This first binary divider 18 will be readily recognized as a double stability state type of multivibrator, including two triodes or a dual triode 20, in which the grid 22 of the first triode is connected to the anode 24 of a second triode through a network 26 comprising a parallel connected resistor and capacitor. The anode 28 of the first triode is connected to the grid 30 of the second triode also through a network 26 comprising a parallel connector resistor and capacitor. The common cathode of the dual triode is connected to ground through a bias resistor which is shunted by a condenser. Each of the grids 22, 30 is connected to ground through its separately associated grid resistor 34. Anode potential is applied from a source of B+ potential through a common resistor 36 and then to the individual anodes 24, 28 through individual resistors 38. In operation, if it is assumed that one of the triodes is drawing anode current, the second triode is biased off. A negative pulse applied to the binary divider at the junction 40 of the common resistor 36 and individual resistors 38, which is the input terminal to the first binary divider, serves to cause the triode which is conducting to be biased off and the triode which was biased off to become conducting. A subsequently applied negative pulse restores the original condition of the triodes. Thus, negative pulses which are successively applied to the junction 40 from the tube 16 cause the first binary divider 18 to operate in the manner described above. As each triode in the first binary divider 18 goes from a non-conducting to a conducting state, its anode potential drops and a negative pulse is generated. As each triode in the first binary divider 18 goes from a conducting to a non-conducting state, its anode potential increases and a positive pulse is generated.

The anode 28 of the first binary divider 18 is connected to the other grid 42 of the dual triode 16. The associated half of the dual triode serves to amplify and invert the negative pulses applied from the anode 28. A gas electron discharge tube 44, such as a thyratron has, its control grid connected to a negative bias source and to the second anode of the dual triode 16. The value of the negative bias is chosen so that only the amplified positive pulses from the anode 46 of the dual triode 16 fire the thyratron 44. The thyratron therefore only fires at every other pulse applied to the input terminal 40 of the first binary divider 18. A condenser is coupled between the thyratron anode and ground. It charges up in the intervals between the pulses which fire the thyratron and it discharges through the thyratron when it is fired. The thyratron serves as a reset pulse generator. Its load resistor is connected to its cathode 45. Other means or types of vacuum tubes may also be used to generate a reset pulse in place of a thyratron. However, I prefer to use the thyratron tube.

A reference frequency oscillator 46 has its output connected to a fixed ratio frequency divider 48. This fixed ratio frequency divider 48 may consist of counting chains, including binary divider stages, having a sufficient number of divider stages to produce the desired low, reference frequency pulses. Some of these stages are resettable by a reset pulse.

The circuit of the last binary divider 50 of the fixed ratio frequency divider is shown in Fig. 1. The output from the last binary divider 50 of the fixed ratio frequency divider 48 is coupled to a second binary divider 52 whose output is coupled to a third binary divider 54. Each of these binary dividers is substantially identical to the first binary divider 18 described above. The cathode 45 of the thyratron 44 is coupled to one grid of the last binary divider 50, whereby, after being reset by a positive pulse from the thyratron two input pulses are required before it applies an operating pulse to the second binary divider 52. The cathode 45 of the thyratron 44 is connected to one grid of the second binary divider 52, whereby, after being reset only one operating pulse is required to be applied to the second binary divider input before an operating pulse is applied by it to the third binary divider. The thyratron cathode 45 is also coupled to one grid of the third binary divider 54. Thus, the second and third binary dividers are both set by the thyratron to what may be thought of as their base or starting condition at the same time as the first binary divider 18 starts a cycle. The first part of a cycle of the third binary divider always corresponds to the first part of a cycle of the second binary divider. The duration of this cycle is equal to one-half the time that would be required by the second binary divider to complete one cycle if it was running free (not being reset). Since the next change of the second binary divider is in the direction that does not affect the third binary divider, the second part of the cycle of the third binary divider would be twice the first part were it not for the fact that it is terminated by the thyratron pulse sooner. Thus, the potential on the anode of the third binary divider changes only once during a complete cycle of the first binary divider. The time interval from the application of the reset pulse until the next change in the anode voltage of the third binary divider is a measure of the frequency applied to the second binary divider. Since this interval starts at the same time as a cycle of the first binary divider, it can be compared with the time of a half cycle of the first binary divider to determine the relative frequencies of the two.

The variable tuned oscillator 10 and the reference frequency oscillator 46 together with their associated frequency divider networks, such as have been here described in general terms, do not form a part of this invention. However, one such a system is fully described and claimed in the above identified application of John G. Woodward.

The output of the reference or fixed ratio frequency divider 48 usually consists of low frequency reference pulses of a negative polarity which may therefore be directly applied to the input terminal 56 of the second binary divider 52. The anodes 24, 28 of the first binary divider 18 are respectively coupled by means of individual resistors 58 to the respective grids 62, 60 of a dual triode 64. The anodes 66, 68 of the third binary divider 54 are also respectively coupled by means of resistors 58 to the respective grids of the dual triode 64. This coupling is made in such a manner that the outputs from the first and third binary dividers oppose each other. This may be seen from the fact that at the time one anode of the first binary divider 18 goes negative, its other anode goes positive. The reset pulse which is generated by the negative going anode 28 of the first binary divider causes the anode 66 in the third binary divider 54 to go negative and the anode 68 which is coupled with anode 28 goes positive. Thus, the outputs from the respective anodes of the first binary divider 18 oppose the outputs from the respective anodes of the third binary divider 54 at the grids 60, 62 of the dual triode 64. The dual triode is biased at cut-off so that any positive resultant appearing at either of the dual triode grids 60, 62 is amplified and appears at the associated anodes 70, 72 of the dual triode 64. Any output which exists on the anodes 70, 72 of the dual triode, as will be more fully explained in connection with Figure 2, consists of pulses having a width or duration dependent upon the difference between the frequencies of the pulses applied to the first and second binary dividers. The anode 70 or 72, upon which these pulses appear is dependent upon whether the pulses applied to the first binary divider 18 are higher or lower in frequency than the pulses applied to the second binary divider 52. Thus the pulses appear on the anode 70 when the frequency of the pulses applied to the first binary divider is lower than the reference pulses applied to the second binary divider 52, and the pulses appear on the anode 72 when the variable ratio frequency divider chain output pulses are higher in frequency than the reference frequency pulses.

The output of the dual triode 64 is then coupled to a utilization device 74 which utilizes this output to regulate the frequency in accordance with the information conveyed by the output. Such a utilization device 74 may be any well known system such as relays which control the operation of a motor which controls the tuning of the oscillator tank of the variable tuning frequency oscillator.

Referring, now, to Figure 2, waveforms of voltages are shown, which occur in various portions of the circuit shown in Figure 1 when the frequency of the pulses applied to the first binary divider 18 is lower than the frequency of the pulses applied to the second binary divider 52. The letters to the left of the graphical waveform representations of Figure 2 are also shown at the various portions of the circuit diagram of Figure 1 in which the waveform identified by the letter exists. The reset pulses from the variable ratio frequency divider 12 are shaped substantially as shown and identified by A in Figure 2. After being inverted by the first half of the duotriode 16 the reset pulse is applied to the input terminal 40 of the first binary divider 18 which results in pulses having the waveform shown by the curves B and C being developed at the respective anodes 24, 28 of the first binary divider 18. The thyratron tube 44, as a result of its coupling to the anode 28, generates reset pulses across its cathode load resistor having the shape shown by the curve D. One of these reset pulses is generated for every two pulses applied to the first binary divider 18.

The curves E and F are representations of the voltage waveshapes which exist on the anodes of the second binary divider 52 which is driven by the output from the last binary stage 50 of the fixed ratio frequency divider 48.

As indicated above and as shown in Figure 1, the third binary divider 54 receives an operating pulse from the second binary divider 52 as a result of the first opearting pulse received by the second binary divider after reset. The second binary divider 52 receives an operating pulse from the last binary divider 50 of the fixed frequency divider stage as a result of the second operating pulse received by the last binary divider stage after reset. Any additional resettable binary dividers, of the fixed frequency divider 48, which are connected to receive a reset pulse from the thyratron cathode 45 are so connected (in the manner shown for the last binary divider 50) that they do not provide an operating pulse for the subsequent binary stage until after having received a second operating pulse after the reset pulse.

As a result of both the reset pulses generated by the thyratron 44 and the pulses from the second binary divider being applied to the third binary divider, voltages exist on the respective anodes 60, 62 having the general wave shapes shown by the curves G, H. It will be noted that the reset pulses have the effect of aligning the first and third binary dividers at every second pulse input to the first binary divider. In the interval between the occurrence of the reset pulses the third binary divider operates in accordance with the pulses impressed upon its input terminal as shown by the waveform curves G, H.

Now graphically combining the curves B and H results in the curve J; and combining the curves C and G results in the curve K. These graphical combinations are physically performed by connecting the plates 24, 28 of the first binary divider 18 through individual summing resistors 58 to the respective grids 60, 62 of the dual triode 64 and connecting the plates 68, 66 of the third binary divider 54 through individual summing resistors 58 also to the respective dual triode grids 60, 62. It will be noted that the width of the resultant pulses shown by the curves J and K are dependent upon the difference in frequencies of the pulses applied to the input terminals of the first and second binary dividers 40, 56. Since the dual triode 64 is biased to cut off, only the positive pulses appearing on the grid 60 are amplified and inverted and applied to the utilization device 74. These inverted positive amplified pulses are represented by the curve L.

When the frequency of the pulses to be compared is higher than the reference frequency, the operation of the apparatus is similar to that described above. Voltage waveshapes for this condition are shown in Figure 3 which are similarly identified as in Fig. 2. It will also be noted that it is the positive resultant pulses appearing on the dual triode grid 62 that are amplified and appear at the utilization device as represented by the curve M. The reset pulses genearted by the thyratron 44 may be applied to as many of the binary divider stages of the fixed frequency counter as desired. The more of these stages to which this reset pulse is applied, the more accurate is the information furnished to the utilization device 74, since this more accurately fixes the moment of alignment of the third binary divider 54 with the first, 18. As described above and as shown in Figures 2 and 3, it is because of this alignment that an accurate frequency comparison can be made. The frequency of the pulses impressed on the first binary divider 18 should not be higher than twice or lower than half the frequency of the pulses impressed on the second binary divider 52.

This requires that, if an oscillator system wherein my present invention is to be incorporated is to be tuned over an extremely wide range, the range must be broken up into bands in such a manner that any frequency in the band to which the oscillator is to be tuned is less than twice and more than half any other frequency in that band.

From the foregoing description, it will be readily apparent that I have provided an improved system for continuously providing error voltage information for regulating one oscillator by means of another reference oscillator. The fact that the embodiment of my invention has been described in connection with a variable tuning oscillator having a variable frequency divider chain and a reference frequency oscillator having a fixed frequency divider chain is not to be taken as limiting. Any two frequency sources may be compared provided the frequencies applied to the first and second binary dividers are the same or within the limits of the operating range previously described. The oscillation which is applied to the first binary divider may be obtained directly or through a variable ratio or fixed ratio frequency divider or multiplier providing the input is so shaped as to operate the first binary divider. A minimum of one resettable binary divider in the fixed ratio frequency divider should be coupled to the second binary divider for proper operation. The use of a large number of resettable binary dividers in the fixed frequency divider gives more accurate operation. The limits of the frequency that may be compared are solely dependent upon the speed of the multivibrator operation and these are well known to be extremely high.

Although I have shown and described but a single embodiment of my present invention, it should be apparent that many changes may be made in the particular embodiment herein disclosed, and that many other embodiments are possible, all within the spirit and scope of my invention. For example, the reference frequency and the controlled frequency may be interchanged, and the intelligence conveyed by the resultant output information is still the same. If desired, the output dual triode may be eliminated and the resultant pulses which would normally appear on either grid may be utilized. In this case, pulses above nominal indicate a frequency deviation on one side, pulses below nominal indicate a frequency deviation on the other side, and the pulse width indicates the amount of frequency deviation. Since many variations are possible, I desire that the foregoing description shall be taken as illustrative and not as limiting.

What is claimed is:

1. A circuit for comparing the frequency of impulses derived from an oscillation source with the frequency of impulses derived from a reference frequency source comprising a first binary divider coupled to one of said sources, means coupled to said first binary divider to generate reset pulses responsive thereto, a second binary divider coupled to the other of said sources, a third binary divider coupled to said second binary divider, means to couple said reset pulse generating means to said other of said sources and to said second and third binary dividers, and means to compare the outputs from said first and third binary dividers to obtain resultant output pulses having a duration dependent upon the difference in frequencey between said first and second pulses.

2. A system for comparing the frequency of pulses derived from an oscillation source with the frequency of pulses derived from a reference frequency source comprising first, second and third multivibrators, each of said multivibrators having a pair of output electrodes, said third multivibrator being coupled to one of said second multivibrator output electrodes, means to apply pulses derived from said oscillation source upon said first multivibrator, reset pulse generating means comprising a gas tube coupled to an output electrode of said first multivibrator, means to apply said reset pulses to said second and third multivibrators and to said oscillation source, means to apply pulses derived from said reference frequency source to said second multivibrator, and means to compare the outputs from said first and second multivibrators comprising a pair of electron tubes each having at least an anode, cathode and grid, each of said electron tubes being biased to be responsive to pulses of one polarity applied to its grid, and means to couple opposingly an output electrode from said first multivibrator and said third multivibrator to each of said grids to provide a pulse output on one of said anodes having a duration dependent upon the difference in said first and second frequency, the one of said anodes on which said latter named pulse appears being determined by whether said first frequency is higher or lower than said second frequency.

3. The combination with a system having a reference frequency oscillator coupled to a fixed ratio frequency dividing chain and providing output pulses therefrom and a variably tuned oscillator coupled to a variable ratio frequency divider such that the lowest output pulse frequency of said variable ratio frequency dividing chain is approximately equal to said output pulse frequency at said fixed ratio frequency dividing chain, of means to regulate the frequency of said variably tuned oscillator with said reference frequency oscillator, said means comprising first, second and third binary dividers, each having an input and an output, said third binary divider having its input coupled to said second binary divider output, means to impress output pulses from said variable ratio frequency divider upon said first binary divider input, means to impress output pulses from said fixed ratio frequency dividing chain on said second binary divider input, means to generate reset pulses responsive to an output from said first binary divider, means to impress said reset pulses on said second and third binary dividers and on said fixed ratio frequency dividing chain, means to opposingly couple the outputs from said first and third binary dividers to derive resultant pulses therefrom having a duration determined by the difference in frequency between said fixed ratio frequency dividing chain output pulses and said variable ratio frequency dividing chain output pulses, and a utilization device responsive to said resultant pulses to regulate the frequency of said variably tuned oscillator accordingly.

4. The combination recited in claim 3 wherein said fixed ratio dividing chain includes resettable binary divider stages and said reset pulses applied to said fixed ratio dividing chain are applicable to said resettable binary divider stages to require the application of two operating pulses to said binary divider stages after a reset pulse in order that said binary divider stages produce an operating pulse for a subsequent stage, and said reset pulses are applicable to said second binary divider to require the application of one operating pulse to said second binary divider after a reset pulse in order that said second binary divider provide an operating pulse for said third binary divider.

5. A frequency comparison system comprising first, second and third binary dividers each having an input terminal and including first and second electron discharge tubes having at least anode, cathode and control grid electrodes and having their anodes and control grids cross connected so that current conduction is shifted from one to another of said elements in response to the application of a voltage pulse to said input terminal, means to generate reset pulses including a gas electron discharge tube coupled to said anode of said first electron tube of said first binary divider, means to impress reset pulses upon said control grids of said first electron tubes of said second and third binary dividers, and a pair of electron discharge tubes each having at least anode, cathode and control grid electrodes, said first tube anode of said first binary divider and said second tube anode of said third binary divider being coupled together and to said control grid of one of said pairs of electron discharge tubes to produce a resultant thereon, said second tube anode of said first binary divider and said first tube anode of said third binary divider being coupled together and to said control grid of the other of said pair of electron discharge tubes to produce a resultant thereon whereby voltage pulses at a first frequency impressed upon the input terminal of said first binary divider and voltage pulses at a second frequency impressed upon the input terminal of said second binary divider result in a voltage pulse at one of the anodes of said pair of electron discharge tubes having a duration dependent upon the difference in frequency of said two voltage pulses, and the one of said anodes at which said latter named voltage pulse appears being determined by the relative frequencies of said applied voltage pulses.

6. The combination with a system having a reference frequency oscillator coupled to a fixed ratio frequency dividing chain to provide output pulses at a low reference frequency and a variably tuned oscillator coupled to a variable ratio frequency dividing chain such that the output frequency therefrom is approximately equal to said reference frequency pulse, of means to regulate the frequency of said variably tuned oscillator with said reference frequency oscillator, said means comprising a first binary divider, a second binary divider, and a third binary divider, each of said binary dividers including first and second electron discharge tubes having anode, cathode and control grid electrodes, a separate resistor connected to each of said anodes and a common resistor for each of said binary dividers, the operating potential for said anodes being applied through said common resistor and through said separate resistors individual to each of said anodes, said anodes and grids being cross connected so that current conduction is shifted from one to another of said first and second tubes in response to the application of a voltage pulse to an input terminal common to said common and separate resistors, a gas electron discharge tube having at least anode, cathode and control grid electrodes, an output load resistor connected to the cathode of said gas tube, means coupling said gas tube control grid to said first tube anode of said first binary divider whereby said gas tube generates reset pulses responsive to output from said first tube anode, means coupling said gas tube output load resistor to said first tube control grids of said second and third binary dividers and to said fixed ratio frequency dividing chain, a pair of electron discharge tubes having at least anode, cathode and control grid electrodes, a first pair of coupling resistors respectively connecting said first tube anode of said first binary divider and said second tube anode of said third binary divider to said control grid of one of said pair of tubes, a second pair of coupling resistors connecting said second tube anode of said first binary divider and said first tube anode of said third binary divider to said control grid of the other of said pair of tubes, means to impress said output pulses from said variable frequency chain on said first binary divider input terminal, means to impress said low reference frequency pulses on said third binary divider input terminal, and a utilization device coupled to the anodes of said pair of tubes to regulate the frequency of said variably tuned oscillators in response to the output from said pair of tubes.

OLIN L. MacSORLEY.

REFERENCES CITED

The following references are of record in the file of this patent:

UNITED STATES PATENTS

| Number | Name | Date |
|---|---|---|
| 2,436,963 | Grosdoff | Mar. 2, 1948 |
| 2,490,404 | Bliss | Dec. 6, 1949 |
| 2,490,499 | Woodward | Dec. 6, 1949 |
| 2,490,500 | Young | Dec. 6, 1949 |

Certificate of Correction

Patent No. 2,558,448 June 26, 1951

OLIN L. MACSORLEY

It is hereby certified that error appears in the printed specification of the above numbered patent requiring correction as follows:

Column 10, line 36, for "pairs" read *pair*; line 61, before "frequency" insert *pulse*;

and that the said Letters Patent should be read as corrected above, so that the same may conform to the record of the case in the Patent Office.

Signed and sealed this 29th day of January, A. D. 1952.

[SEAL]

THOMAS F. MURPHY,
*Assistant Commissioner of Patents.*